US012176912B2

(12) United States Patent
Roh et al.

(10) Patent No.: US 12,176,912 B2
(45) Date of Patent: Dec. 24, 2024

(54) ELECTRONIC DEVICES CONVERTING INPUT SIGNALS TO DIGITAL VALUE AND OPERATING METHODS OF ELECTRONIC DEVICES

(71) Applicant: Samsung Electronics Co., Ltd., Suwon-si (KR)

(72) Inventors: Kyoungjun Roh, Hwaseong-si (KR); Jaewoo Park, Yongin-si (KR); Myoungbo Kwak, Seoul (KR); Jejoong Woo, Suwon-si (KR); Junghwan Choi, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 168 days.

(21) Appl. No.: 17/974,703

(22) Filed: Oct. 27, 2022

(65) Prior Publication Data

US 2023/0291412 A1    Sep. 14, 2023

(30) Foreign Application Priority Data

Mar. 11, 2022 (KR) .................. 10-2022-0030516
May 18, 2022 (KR) .................. 10-2022-0060757
May 26, 2022 (KR) .................. 10-2022-0064805

(51) Int. Cl.
*H03M 1/18*   (2006.01)
*H03M 1/12*   (2006.01)
(Continued)

(52) U.S. Cl.
CPC ........... *H03M 1/186* (2013.01); *H03M 1/121* (2013.01); *H03M 1/48* (2013.01); *H03M 1/10* (2013.01); *H03M 1/12* (2013.01)

(58) Field of Classification Search
CPC ........ H03M 1/186; H03M 1/121; H03M 1/48; H03M 1/12; H03M 1/10; H03M 1/83
See application file for complete search history.

(56) References Cited

U.S. PATENT DOCUMENTS 7,245,638 B2   7/2007  Agazzi et al.
8,243,866 B2   8/2012  Huang et al.
(Continued)

OTHER PUBLICATIONS

Haidang Lin, et al., "ADC-DSP-Based 10-112-GB/s Multi-Standard Receiver in 7-nm FinFET", IEEE Journal of Solid-State Circuits, vol. 56, No., 4, Apr. 2021.

(Continued)

*Primary Examiner* — Joseph J Lauture
(74) *Attorney, Agent, or Firm* — Myers Bigel, P.A.

(57) ABSTRACT

An electronic device which may include an analog-to-digital converter circuit that converts a level of an input signal to digital input values in response to a clock signal, an oscillator that generates the clock signal, a first equalization circuit that generates digital output signals by equalizing the digital input values, a first phase detector circuit that detects phases of the digital output signals and generates digital phase values, a loop filter that generates a first digital output value based on the digital phase values, a second equalization circuit that generates digital intermediate values by equalizing the digital input values, and a second phase detector circuit that detects phases of the digital intermediate values and to generate a second digital output value. The oscillator may adjust a frequency of the clock signal based on the first digital output value and the second digital output value.

18 Claims, 13 Drawing Sheets

(51) Int. Cl.
*H03M 1/48* (2006.01)
*H03M 1/10* (2006.01)

(56) References Cited

U.S. PATENT DOCUMENTS

| | | |
|---|---|---|
| 8,363,683 B2 | 1/2013 | Agazzi et al. |
| 8,693,596 B1 | 4/2014 | Warner et al. |
| 8,744,024 B2 | 6/2014 | Huang et al. |
| 9,048,999 B2 | 6/2015 | He et al. |
| 9,143,367 B2 | 9/2015 | Aziz et al. |
| 9,344,272 B1 | 5/2016 | Zortea et al. |
| 10,536,155 B1 * | 1/2020 | Otte .................. G06F 11/0751 |
| 10,756,931 B2 | 8/2020 | Musah et al. |
| 2006/0280240 A1 * | 12/2006 | Kikugawa ........ G11B 20/10009 375/327 |

OTHER PUBLICATIONS

Masum Hossain, et al., "DDJ-Adaptive SAR TDC-Based Timing Recovery for Multilevel Signaling", IEEE Journal of Solid-State Circuits, vol. 54, No. 10, Oct. 2019.

* cited by examiner

ELECTRONIC DEVICES CONVERTING INPUT SIGNALS TO DIGITAL VALUE AND OPERATING METHODS OF ELECTRONIC DEVICES

CROSS-REFERENCE TO RELATED APPLICATIONS

This application claims priority under 35 U.S.C. § 119 to Korean Patent Application Nos. 10-2022-0030516 filed on Mar. 11, 2022, 10-2022-0060757 filed on May 18, 2022, and 10-2022-0064805 filed on May 26, 2022, in the Korean Intellectual Property Office, and the entire contents of each above-identified application are incorporated by reference herein.

TECHNICAL FIELD

Aspects of the present disclosure relate to electronic devices, and more particularly, relate to electronic devices that convert or are configured to convert an input signal to digital values, and to operating methods of such electronic devices.

BACKGROUND

An electronic device may operate using digital signals internally, but may communicate with another electronic device using analog signals. In order to switch between analog and digital signals, the electronic device may include a way that convert an analog signal received from an external electronic device to a digital value, such as a receiver.

Electronic devices having improved performance characteristics (e.g., speed) are increasingly desired. For example, two electronic devices may communicate more rapidly with each other using higher-frequency analog signals. However, when a frequency at which the electronic device communicates with the external electronic device increases, the influence of jitter in the signal received from the external electronic device may increase. Accordingly, a conventional receiver included in the electronic device may be incapable of normally converting to a digital value an analog signal having a higher frequency that is received from the external electronic device.

SUMMARY

Aspects of the present disclosure provide an electronic device capable of suppressing a jitter even though a frequency of an analog signal received from an external electronic device increases, and an operating method of the electronic device.

According to some embodiments, an electronic device may include an analog-to-digital converter circuit that converts a level of an input signal to digital input values in response to a clock signal, an oscillator that generates the clock signal, a first equalization circuit that generates digital output signals by equalizing the digital input values, a first phase detector circuit that detects phases of the digital output signals and generates digital phase values, a loop filter that generates a first digital output value based on the digital phase values, a second equalization circuit that generates digital intermediate values by equalizing the digital input values, and a second phase detector circuit that detects phases of the digital intermediate values and generates a second digital output value. The oscillator may adjust a frequency of the clock signal based on the first digital output value and the second digital output value.

According to some embodiments, an electronic device may include an analog-to-digital converter circuit that converts a level of an input signal to digital input values in response to a clock signal, an oscillator that generates the clock signal, a first equalization circuit that operates in response to the clock signal and generates digital output signals by equalizing the digital input values, a first phase detector circuit that operates in synchronization with the clock signal and detects phases of the digital output signals and generates digital phase values, a loop filter that operates in response to the clock signal and generates a first digital output value based on the digital phase values, a second equalization circuit that generates digital intermediate values by equalizing the digital values asynchronously, and a second phase detector circuit that detects phases of the digital intermediate values asynchronously and generates a second digital output value. The oscillator may adjust a frequency of the clock signal based on the first digital output value and the second digital output value.

According to some embodiments, an operation method of an electronic device which includes a first equalization circuit and a second equalization circuit may include: receiving an input signal, converting a level of the input signal to a digital input value based on a conversion frequency, equalizing, at the first equalization circuit, the digital input value to generate a first output value, equalizing, at the second equalization circuit, the digital value to generate a second output value, and adjusting the conversion frequency based on the first output value and the second output value.

BRIEF DESCRIPTION OF THE FIGURES

The above and other objects and features of the present disclosure will become apparent by describing in detail some examples of embodiments thereof with reference to the accompanying drawings.

DETAILED DESCRIPTION

Below, some examples of embodiments of the present disclosure will be described in detail and with sufficient clarity to permit those of ordinary skill in the art to implement the inventive concepts of the present disclosure.

Figure 1:
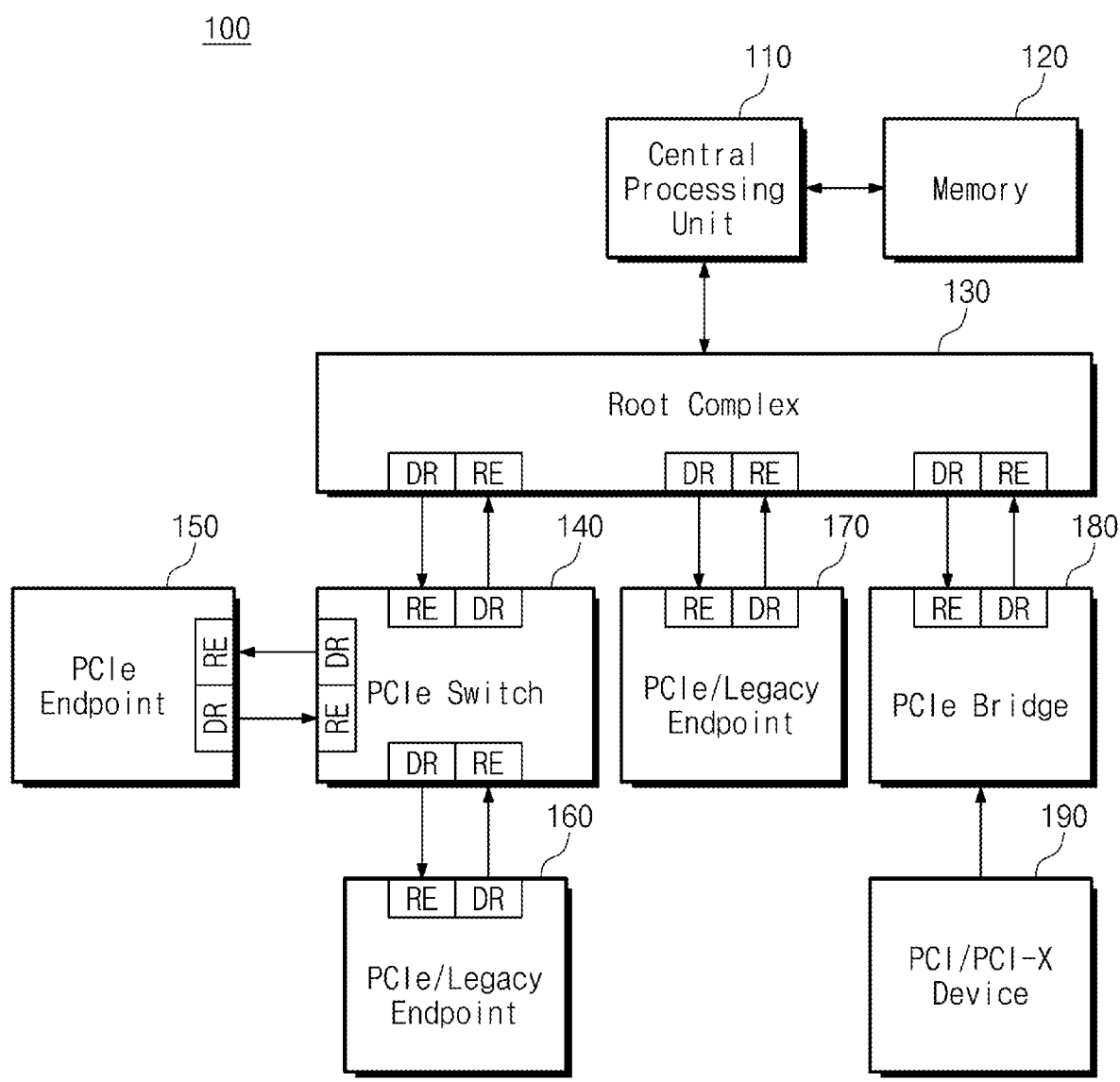
FIG. 1 illustrates a system according to some embodiments of the present disclosure.

FIG. 1 illustrates a system 100 according to some embodiments of the present disclosure. Referring to FIG. 1, the system 100 may include a central processing unit 110, a memory 120, a root complex 130, a PCIe switch 140, a PCIe endpoint 150, a PCIe/legacy endpoint 160, a PCIe/legacy endpoint 170, a PCIe bridge 180, and a PCI/PCI-X device 190. Herein, PCI may be an abbreviation of "Peripheral Component Interconnect," and PCIe may be an abbreviation of "Peripheral Component Interconnect express."

The central processing unit 110 may execute an operating system and applications of the system 100. The central processing unit 110 may load and execute the operating system and the applications to and from the memory 120. The central processing unit 110 may store, in the memory 120, various data, which may be generated and used in the process of employing the system 100.

The memory 120 may be a system memory, examples of which may include a dynamic random access memory (DRAM), a storage class memory (SCM), or the like. The memory 120 may be implemented with, as examples, a dual in-line memory module (DIMM), a registered DIMM (RDIMM), a load reduced DIMM (LRDIMM), a nonvolatile DIMM (NVDIMM), or the like.

The root complex 130 may communicate with the components of the system 100 under control of the central processing unit 110. The root complex 130 may operate based on PCIe. The root complex 130 may include PCIe drivers DR for sending analog signals to external electronic devices and PCIe receivers RE for receiving analog signals from the external electronic devices.

The PCIe switch 140 may arbitrate the communications between the root complex 130 and other PCIe-based electronic devices (e.g., the PCIe endpoint 150 and the PCIe/legacy endpoint 160). The PCIe switch 140 may include PCIe drivers DR for sending analog signals to external electronic devices and PCIe receivers RE for receiving analog signals from the external electronic devices.

The PCIe endpoint 150 or the PCIe/legacy endpoint 160 may communicate with the root complex 130 through the PCIe switch 140. The PCIe endpoint 150 or the PCIe/legacy endpoint 160 may include various peripheral devices such as a digital signal processor, a hardware accelerator (e.g., a graphics processing unit or a neural processor), and a storage device (e.g., a hard disk drive or a solid state drive). The PCIe endpoint 150 or the PCIe/legacy endpoint 160 may include PCIe drivers DR for sending analog signals to external electronic devices and PCIe receivers RE for receiving analog signals from the external electronic devices.

The PCIe/legacy endpoint 170 may include a PCIe endpoint or a PCIe/legacy endpoint. The PCIe/legacy endpoint 170 may be directly coupled to the root complex 130 without a PCIe switch 140 therebetween. The PCIe/legacy endpoint 170 may include PCIe drivers DR for sending analog signals to external electronic devices and PCIe receivers RE for receiving analog signals from the external electronic devices.

The PCIe bridge 180 may arbitrate the communication between the PCI/PCI-X device 190 and the root complex 130. The PCIe bridge 180 may include a PCIe driver DR for sending analog signals to an external electronic device and a PCIe receiver RE for receiving analog signals from the external electronic device. The PCI/PCI-X device 190 may communicate the root complex 130 through the PCIe bridge 180.

As the generation of the PCIe standard increases, a frequency at which a PCIe-based electronic device (e.g., 130, 140, 150, 160, 170, or 180) communicates with an external electronic device is increasing. A receiver RE of the PCIe-based electronic device may be configured to convert an analog signal received from an external electronic device to a digital value. As a communication frequency increases, the influence of a jitter of the analog signal received by the receiver RE may increase. The increase in the influence of the jitter may cause an error when the receiver RE converts an analog signal to a digital value.

Figure 2:
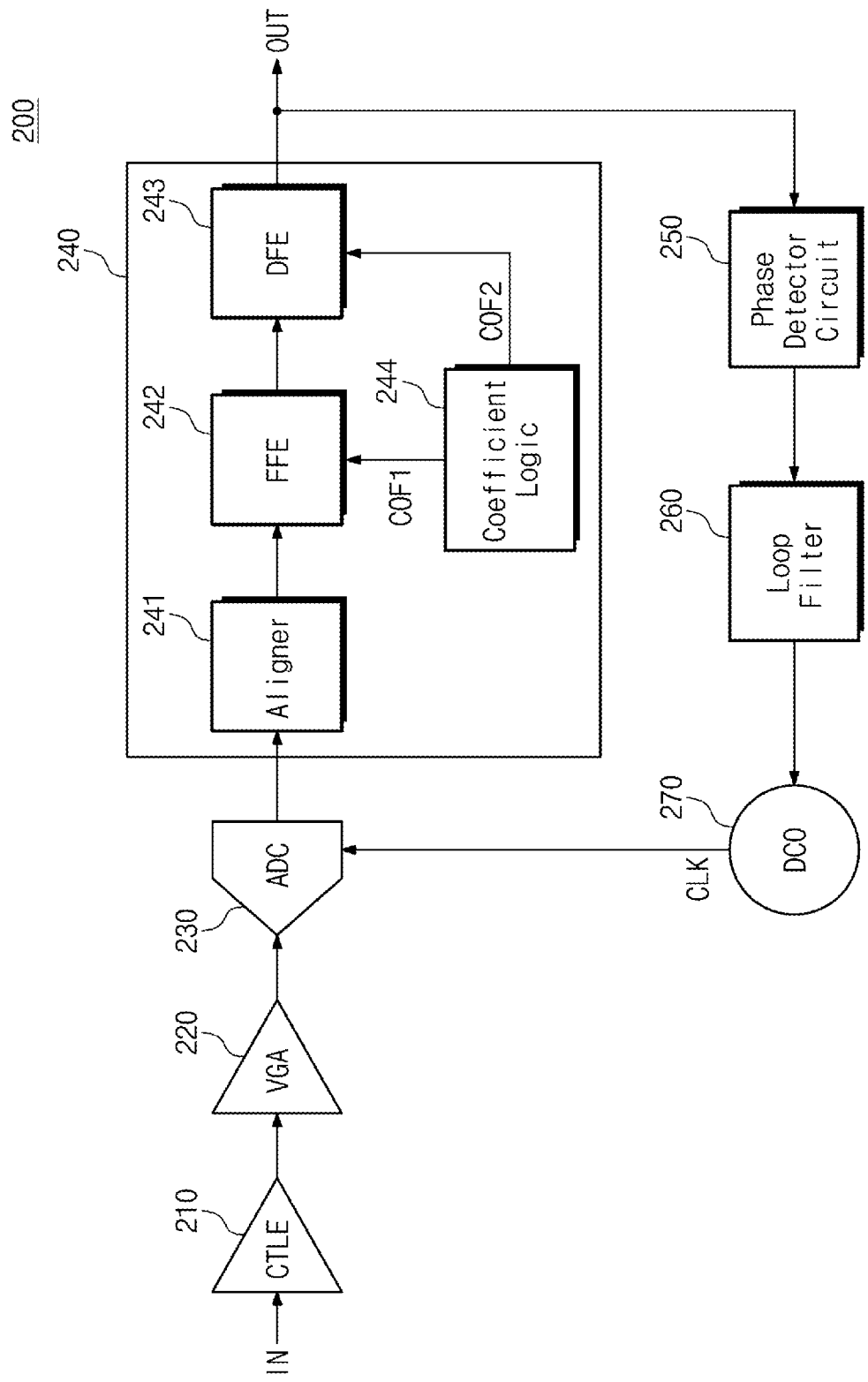
FIG. 2 illustrates a receiver according to some embodiments of the present disclosure.

FIG. 2 illustrates a receiver 200 according to some embodiments of the present disclosure. The receiver 200 may correspond to the receiver RE of the PCIe-based electronic device (e.g., 130, 140, 150, 160, 170, or 180) described with reference to FIG. 1.

Referring to FIG. 2, the receiver 200 may include a continuous time linear equalizer (CTLE) 210, a variable gain amplifier (VGA) 220, an analog-to-digital converter circuit 230, a first equalization circuit 240, a phase detector circuit 250, a loop filter 260, and a digital controlled oscillator (DCO) 270.

The continuous time linear equalizer 210 may perform high-band pass filtering on an input signal IN. The variable gain amplifier 220 may amplify an output signal of the continuous time linear equalizer 210 based on a variable gain. The analog-to-digital converter circuit 230 may convert a level of an output signal of the variable gain amplifier 220 to digital values in synchronization with a clock signal CLK.

The first equalization circuit 240 may equalize the digital values output from the analog-to-digital converter circuit 230. For example, the first equalization circuit 240 may remove an inter-symbol interference (ISI). The first equalization circuit 240 may operate at a baud rate in synchronization with the clock signal CLK. The first equalization circuit 240 may include an aligner 241, a feed forward equalization circuit 242, a decision feedback equalization circuit 243, and coefficient logic 244.

The aligner 241 may align phases of the digital values output from the analog-to-digital converter circuit 230. The feed forward equalization circuit 242 may perform a feed forward equalization operation on first coefficients COF1 that are output from the coefficient logic 244. The decision feedback equalization circuit 243 may perform a decision feedback equalization operation based on second coefficients COF2 that are output from the coefficient logic 244. The decision feedback equalization circuit 243 may output an equalization result as a digital output signal OUT. The coefficient logic 244 may adaptively adjust the first coefficients COF1 or the second coefficients COF2 outputted therefrom based on the digital values or the digital output signal OUT.

The phase detector circuit 250 may detect a phase from the digital output signal OUT. For example, the phase detector circuit 250 may detect whether the phase (or timing) at which the analog-to-digital converter circuit 230 converts a level of an analog signal to a digital value is accurate, early, or late. The loop filter 260 (e.g., a digital loop filter) may integrate outputs of the phase detector circuit 250. The digital controlled oscillator 270 (or a voltage controlled oscillator) may adjust a frequency and a phase of the clock signal CLK in response to an output of the loop filter 260.

The first equalization circuit 240, the phase detector circuit 250, and the loop filter 260 may form an integral path and a proportional path. The integral path may generate information (e.g., accurate, early, or late) of past timings at which the level of the analog signal is converted to the digital values. An integral value (e.g., a first digital value) obtained from the integral path may be used to adjust the frequency of the clock signal CLK. The proportional path may generate information (e.g., accurate, early, or late) of a current timing at which the level of the analog signal is converted to the digital values. A proportional value (e.g., a second digital value) obtained from the proportional path may be used to adjust the phase of the clock signal CLK. In the receiver 200 of FIG. 2, the integral path and the proportional path may be integrally implemented.

In the receiver 200 of FIG. 2, phase information of a specific timing at which the level of the analog signal is converted to the digital value is transferred to the digital controlled oscillator 270 through the first equalization circuit 240, the phase detector circuit 250, and the loop filter 260. Until the phase information is used to adjust the frequency and phase of the clock signal CLK, the receiver 200 may require several to several tens of cycles. Accordingly, as the frequency of the input signal IN increases, the influence of the jitter may increase in the receiver 200.

Figure 3:
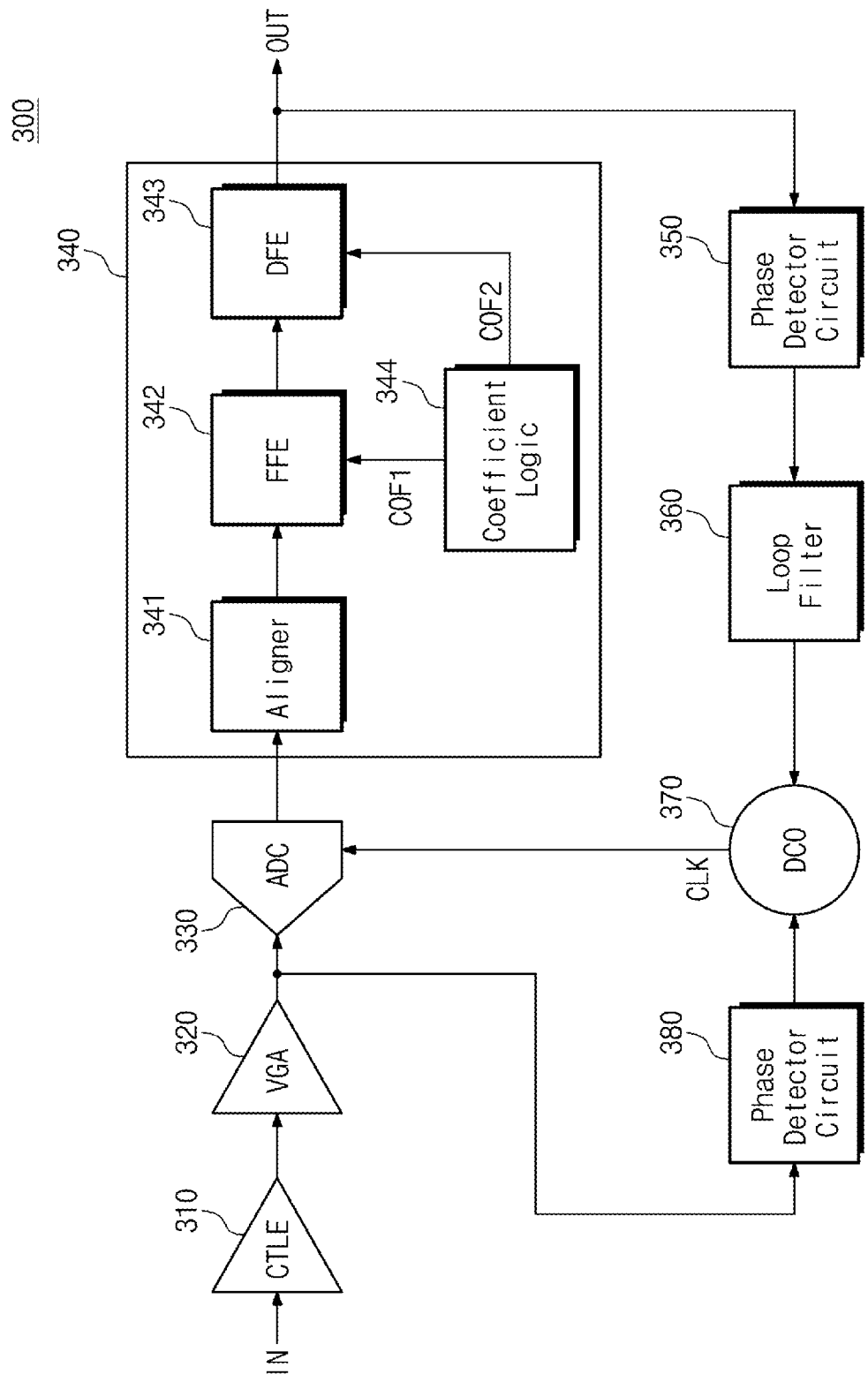
FIG. 3 illustrates a receiver according to some embodiments of the present disclosure.

FIG. 3 illustrates a receiver 300 according to some embodiments of the present disclosure. The receiver 300 may correspond to the receiver RE of the PCIe-based electronic device (e.g., 130, 140, 150, 160, 170, or 180) described with reference to FIG. 1.

Referring to FIG. 3, the receiver 300 may include a continuous time linear equalizer (CTLE) 310, a variable gain amplifier (VGA) 320, an analog-to-digital converter circuit 330, a first equalization circuit 340, a first phase detector circuit 350, a loop filter 360, a digital controlled oscillator (DCO) 370, and a second phase detector circuit 380.

The continuous time linear equalizer 310 may perform high-band pass filtering on the input signal IN. The variable gain amplifier 320 may amplify an output signal of the continuous time linear equalizer 310 based on a variable gain. The analog-to-digital converter circuit 330 may convert a level of an output signal of the variable gain amplifier 320 to digital values in synchronization with the clock signal CLK.

The first equalization circuit 340 may equalize the digital values output from the analog-to-digital converter circuit 330. For example, the first equalization circuit 340 may remove an inter-symbol interference (ISI). The first equalization circuit 340 may operate at a baud rate in synchronization with the clock signal CLK. The first equalization circuit 340 may include an aligner 341, a feed forward equalization circuit 342, a decision feedback equalization circuit 343, and coefficient logic 344.

The aligner 341 may align phases of the digital values output from the analog-to-digital converter circuit 330. The feed forward equalization circuit 342 may perform the feed forward equalization operation based on the first coefficients COF1 that are output from the coefficient logic 344. The decision feedback equalization circuit 343 may perform the decision feedback equalization operation based on second coefficients COF2 that are output from the coefficient logic 344. The decision feedback equalization circuit 343 may output an equalization result as the digital output signal OUT. The coefficient logic 344 may adaptively adjust the first coefficients COF1 or the second coefficients COF2 outputted therefrom based on the digital values or the digital output signal OUT.

The phase detector circuit 350 may detect a phase from the digital output signal OUT. For example, the phase detector circuit 350 may detect whether the phase (or timing) at which the analog-to-digital converter circuit 330 converts a level of an analog signal to a digital value is accurate, early, or late. The loop filter 360 (e.g., a digital loop filter) may integrate outputs of the first phase detector circuit 350. The digital controlled oscillator 370 (or a voltage controlled oscillator) may adjust a frequency of the clock signal CLK in response to an output of the loop filter 360.

The first equalization circuit 340, the first phase detector circuit 350, and the loop filter 360 may form an integral path. The integral path may generate information (e.g., accurate, early, or late) of past timings at which the level of the analog signal is converted to the digital values. As an integral value (e.g., a first digital value), the output of the loop filter 360 may be used to adjust the frequency of the clock signal CLK.

The second phase detector circuit 380 may detect a phase of the analog signal output from the variable gain amplifier 320. For example, the second phase detector circuit 380 may over-sample the analog signal to detect whether the phase of the analog signal coincides with the phase of the clock signal CLK, is early with respect to the phase of the clock signal CLK, or late with respect to the clock signal CLK. An output of the second phase detector circuit 380 may be used for the digital controlled oscillator 370 (or a voltage controlled oscillator) to adjust the phase of the clock signal CLK. The second phase detector circuit 380 may include a bang-bang phase detector.

The second phase detector circuit 380 may form a proportional path. The proportional path may generate information (e.g., accurate, early, or late) of a current timing at which the level of the analog signal is converted to the digital value. As a proportional value (e.g., a second digital value), an output of the second phase detector circuit 380 may be used to adjust the phase of the clock signal CLK. Accordingly, compared to the receiver 200 of FIG. 2, the jitter may decrease.

However, the second phase detector circuit 380 is configured to detect a phase from an analog signal that is not equalized. Accordingly, the inter-symbol interference (ISI) may be applied to the proportional value. In this case, as the frequency of the input signal IN increases, the influence of the jitter may increase in the receiver 300.

Figure 4:
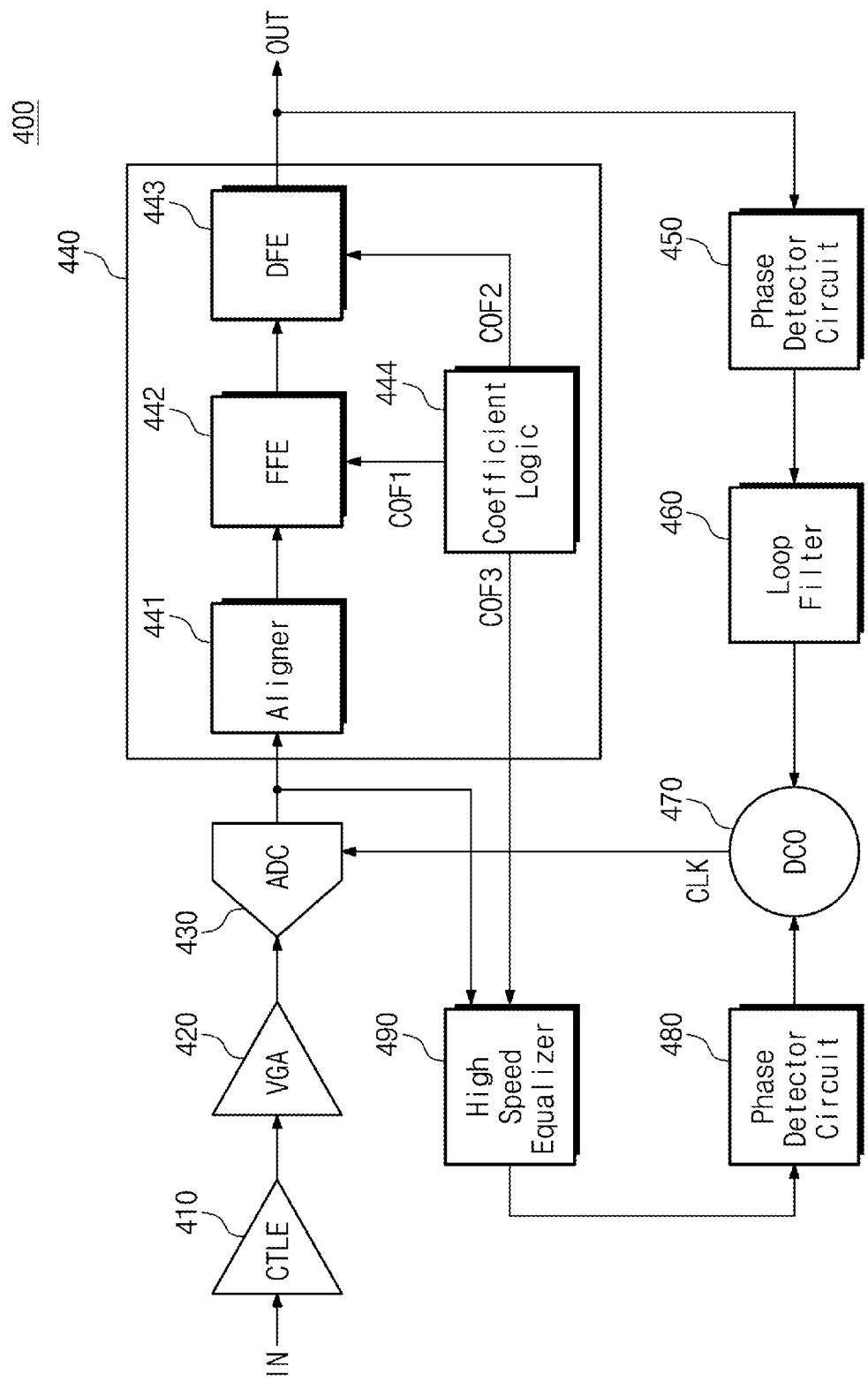
FIG. 4 illustrates a receiver according to some embodiments of the present disclosure.

FIG. 4 illustrates a receiver 400 according to some embodiments of the present disclosure. The receiver 400 may correspond to the receiver RE of the PCIe-based electronic device (e.g., 130, 140, 150, 160, 170, or 180) described with reference to FIG. 1.

Referring to FIG. 4, the receiver 400 may include a continuous time linear equalizer (CTLE) 410, a variable gain amplifier (VGA) 420, an analog-to-digital converter circuit 430, a first equalization circuit 440, a first phase detector circuit 450, a loop filter 460, a digital controlled oscillator (DCO) 470, a second phase detector circuit 480, and a high-speed equalization circuit (or a second equalization circuit) 490.

The continuous time linear equalizer 410 may perform high-band pass filtering on the input signal IN. The variable gain amplifier 420 may amplify an output signal of the continuous time linear equalizer 410 based on a variable gain. The analog-to-digital converter circuit 430 may convert a level of an output signal of the variable gain amplifier 420 to digital values in synchronization with the clock signal CLK.

The first equalization circuit 440 may equalize the digital values output from the analog-to-digital converter circuit 430. For example, the first equalization circuit 440 may remove an inter-symbol interference (ISI). The first equalization circuit 440 may operate at a baud rate in synchronization with the clock signal CLK. The first equalization circuit 440 may include an aligner 441, a feed forward equalization circuit 442, a decision feedback equalization circuit 443, and coefficient logic 444.

The aligner 441 may align phases of the digital values output from the analog-to-digital converter circuit 430. The feed forward equalization circuit 442 may perform the feed forward equalization operation based on the first coefficients COF1 that are output from the coefficient logic 444. The decision feedback equalization circuit 443 may perform the decision feedback equalization operation based on the second coefficients COF2 that are output from the coefficient logic 444. The decision feedback equalization circuit 443 may output an equalization result as the digital output signal OUT. The coefficient logic 444 may adaptively adjust the first coefficients COF1 or the second coefficients COF2 outputted therefrom based on the digital values or the digital output signal OUT. The coefficient logic 444 may also output third coefficients COF3, discussed further below, and adaptively adapt the third coefficients COF3 based on the digital values or the digital output signal OUT.

The first phase detector circuit 450 may detect a phase from the digital output signal OUT. For example, the first phase detector circuit 450 may detect whether the phase (or timing) at which the analog-to-digital converter circuit 430 converts a level of an analog signal to a digital value is accurate, early, or late. The loop filter 460 (e.g., a digital loop filter) may integrate outputs of the first phase detector circuit 450. The digital controlled oscillator 470 (or a voltage controlled oscillator) may adjust a frequency of the clock signal CLK in response to an output of the loop filter 460.

The first equalization circuit 440, the first phase detector circuit 450, and the loop filter 460 may form an integral path. The integral path may generate information (e.g., accurate, early, or late) of past timings at which the level of the analog signal is converted to the digital values. As an integral value (e.g., a first digital value), the output of the loop filter 460 may be used to adjust the frequency of the clock signal CLK.

The second phase detector circuit 480 may detect a phase of an analog signal output from the high-speed equalization circuit 490. The high-speed equalization circuit 490 may perform an asynchronous high-speed equalization operation on digital values output from the analog-to-digital converter circuit 430. The high-speed equalization circuit 490 may perform equalization based on the third coefficients COF3 output from the coefficient logic 444. In some embodiments, the third coefficients COF3 may be some of the first coefficients COF1. The second phase detector circuit 480 may generate a proportional value from the equalized digital values, based on information of a phase (or a timing) at which the analog-to-digital converter circuit 430 recently converts a level of the analog signal to a digital value. The proportional value may be used to adjust the phase of the clock signal CLK.

As compared to the receiver 200 of FIG. 2 and the receiver 300 of FIG. 3, in the receiver 400 of FIG. 4 the influence of the inter-symbol interference (ISI) in the proportional value may be suppressed, and the jitter may significantly decrease in the receiver 400. Also, even though the frequency of the input signal IN increases, the influence of the jitter may be suppressed in the receiver 400. The second phase detector circuit 480 may operate at the baud rate. Accordingly, the receiver 400 may not require an additional clock signal for oversampling. For example, the second phase detector circuit 480 may include a Mueller Muller phase detector(s).

Figure 5:
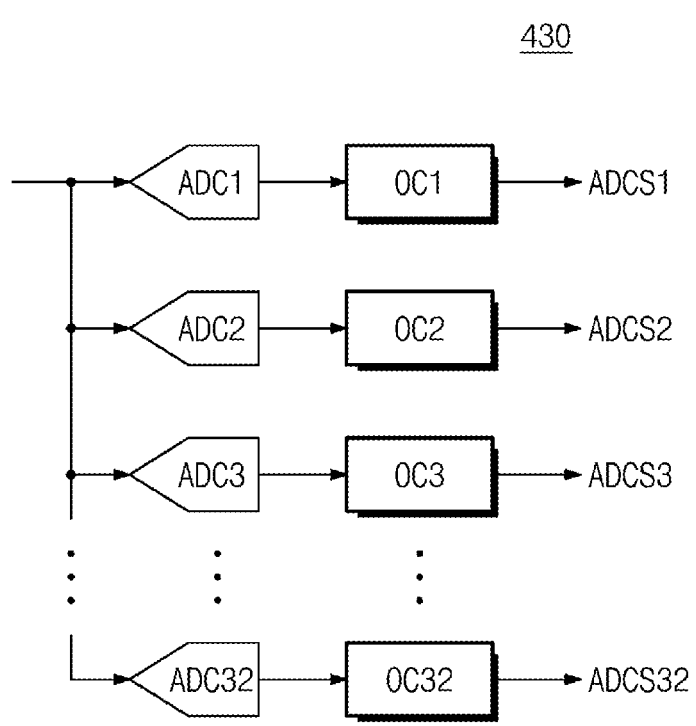
FIG. 5 illustrates an analog-to-digital converter circuit according to some embodiments of the present disclosure.

FIG. 5 illustrates the analog-to-digital converter circuit 430 according to some embodiments of the present disclosure. Referring to FIGS. 4 and 5, the analog-to-digital converter circuit 430 may include a plurality of analog-to-digital converters ADC1 to ADC32 and a plurality of offset compensators OC1 to OC32.

In an embodiment, an operating frequency of each of the plurality of analog-to-digital converters ADC1 to ADC32 may be lower than a frequency of the input signal IN. For example, the frequency of the input signal IN may be 32 GHZ, and the operating frequency of each of the plurality of analog-to-digital converters ADC1 to ADC32 may be 1 GHz. The plurality of analog-to-digital converters ADC1 to ADC32 may convert a level of an input analog signal to digital values in a time interleaving manner.

At a first timing, the first analog-to-digital converter ADC1 may convert the level of the input analog signal to a digital value. At a second timing, the second analog-to-digital converter ADC2 may convert the level of the input analog signal to a digital value. At a k-th timing (k being an integer between 1 and 32), the k-th analog-to-digital converter ADCk may convert the level of the input analog signal to a digital value. At a 32nd timing, the 32nd analog-to-digital converter ADC32 may convert the level of the input analog signal to a digital value. Afterwards, the first analog-to-digital converter ADC1 may again convert the level of the analog signal to a digital value.

The first to 32nd analog-to-digital converters ADC1 to ADC32 that operate in the time interleaving manner and have the operating frequency of 1 GHz may constitute the analog-to-digital converter circuit 430 having the operating frequency of 32 GHz. For example, the clock signal CLK may include 32 1-GHz clock signals having different phases. The first to 32nd analog-to-digital converters ADC1 to ADC32 may respectively operate in synchronization with the 32 1-GHz clock signals having different phases.

For example, the clock signal CLK may have the frequency of 1 GHZ, and the first to 32nd analog-to-digital converters ADC1 to ADC32 may operate at different timings in synchronization with the clock signal CLK. In some embodiments, each of the first to 32nd analog-to-digital converters ADC1 to ADC32 may have a 5-bit to 8-bit resolution, as examples.

The digital values generated by the first to 32nd analog-to-digital converters ADC1 to ADC32 may be transferred to the first to 32nd offset compensators OC1 to OC32. The first to 32nd offset compensators OC1 to OC32 may respectively change offsets of the first to 32nd analog-to-digital converters ADC1 to ADC32. The first to 32nd offset compensators OC1 to OC32 may output first to 32nd analog-to-digital conversion signals ADCS1 to ADCS32 (e.g., digital values) in which offset compensation is made.

Although the description herein is given as the analog-to-digital converter circuit 430 including 32 analog-to-digital converts and 32 offset compensators, the number of analog-to-digital converters and the number of offset compensators are not limited thereto. For example, in some embodiments the number of analog-to-digital converters and the number of offset compensators may be set to a multiple (e.g., 64 or 128) of a value that is obtained by dividing the frequencies of the input signal IN by an operating frequency of each analog-to-digital converter.

The first to 32nd analog-to-digital conversion signals ADCS1 to ADCS32 may have different phases. The aligner 441 may align phases of the first to 32nd analog-to-digital conversion signals ADCS1 to ADCS32 to be in phase. The first equalization circuit 440 may operate at a baud rate based on the digital values that are aligned to be in phase and have the frequency of 1 GHz.

Figure 6:
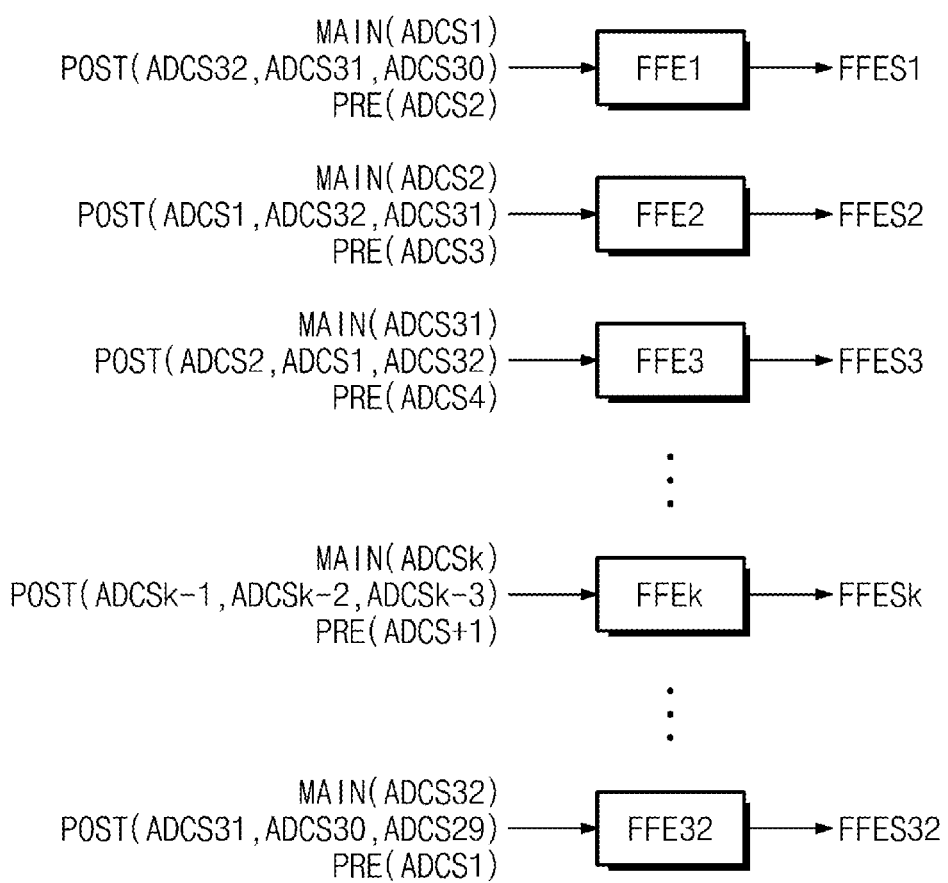
FIG. 6 illustrates a feed forward equalization circuit or a high-speed equalization circuit according to some embodiments of the present disclosure.

FIG. 6 illustrates the feed forward equalization circuit 442 or the high-speed equalization circuit 490 according to some embodiments of the present disclosure. Referring to FIGS. 4 and 6, the feed forward equalization circuit 442 or the high-speed equalization circuit 490 may include first to 32nd feed forward equalizers FFE1 to FFE32. Each of the first to 32nd feed forward equalizers FFE1 to FFE32 may perform equalization based on a main signal, a pre signal, and a post signal among the first to 32nd analog-to-digital conversion signals ADCS1 to ADCS32.

The main signal may include a target signal that each of the first to 32nd feed forward equalizers FFE1 to FFE32 intends to equalize. The post signal may include signals received immediately before the main signal. The pre signal may include a signal(s) received after the main signal.

For example, the first feed forward equalizer FFE1 may generate a first feed forward equalization signal FFES1 by multiplying the first analog-to-digital conversion signal ADCS1 being the main signal by a main coefficient of the first coefficients COF1 or the third coefficients COF3, multiplying the 30th analog-to-digital conversion signal ADCS30, the 31st analog-to-digital conversion signal ADCS31, and the 32nd analog-to-digital conversion signal ADCS32 being the post signal by respective post coefficients of the first coefficients COF1 or the third coefficients COF3, multiplying the second analog-to-digital conversion signal ADCS2 being the pre signal by the main coefficient of the first coefficients COF1 or the third coefficients COF3, and adding the multiplication results.

The k-th feed forward equalizer FFEk may generate a k-th feed forward equalization signal FFESk by multiplying the k-th analog-to-digital conversion signal ADCSk being the main signal by the main coefficient of the first coefficients COF1 or the third coefficients COF3, multiplying the (k-3)-th analog-to-digital conversion signal ADCSk-3 (e.g., k-3+32 when "k-3" is smaller than "1"), the (k-2)-th analog-to-digital conversion signal ADCSk-2 (e.g., k-2+32 when "k-2" is smaller than "1"), and the (k-1)-th analog-to-digital conversion signal ADCSk-1 (e.g., k-1+32 when "k-1" is smaller than "1") being the post signal by the respective post coefficients of the first coefficients COF1 or the third coefficients COF3 respectively, multiplying the (k+1)-th analog-to-digital conversion signal ADCSk+1 (e.g., k+1-32 when "k+1" is greater than "32") being the pre signal by the main coefficient of the first coefficients COF1 or the third coefficients COF3, and adding the multiplication results.

As illustrated in FIG. 6, in the case where each of the first to 32nd feed forward equalizers FFE1 to FFE32 uses 5 coefficients, the first to 32nd feed forward equalizers FFE1 to FFE32 may be 5-tap feed forward equalizers. In some embodiments, for high-speed equalization, the number of taps of the high-speed equalization circuit 490 may be less than the number of taps of the feed forward equalization circuit 442.

For example, the high-speed equalization circuit 490 may be a 5-tap equalizer that uses three post signals and one pre signal. The feed forward equalization circuit 442 may be a 9-tap equalizer that uses five post signals and three pre signals. Because the number of pre signals used in the high-speed equalization circuit 490 is less than the number of pre signals used in the feed forward equalization circuit 442, a time at which the equalization is completed in the high-speed equalization circuit 490 may be advanced. However, the number of taps of the high-speed equalization circuit 490 and the number of taps of the feed forward equalization circuit 442 are not limited by those expressly described herein.

The feed forward equalization circuit 442 may perform synchronous equalization on digital signals passing through the aligner 441. The high-speed equalization circuit 490 may perform asynchronous equalization on digital signals of different phases, which do not pass through the aligner 441. Because the alignment time of the aligner 441 is omitted, the equalization speed of the high-speed equalization circuit 490 may be further improved. As another example, the high-speed equalization circuit 490 may be modified to receive aligned digital signals passing through the aligner 441.

The third coefficients COF3 may be some of the first coefficients COF1. The high-speed equalization circuit 490 may use some of the first coefficients COF1, which are adaptively determined in the coefficient logic 444 in association with the feed forward equalization circuit 442, as the third coefficients COF3. Accordingly, the equalization speed of the high-speed equalization circuit 490 may be further improved.

In some embodiments, the number of feed forward equalizers of the feed forward equalization circuit 442 may be set to coincide with the number of analog-to-digital converters of the analog-to-digital converter circuit 430.

Figure 7:
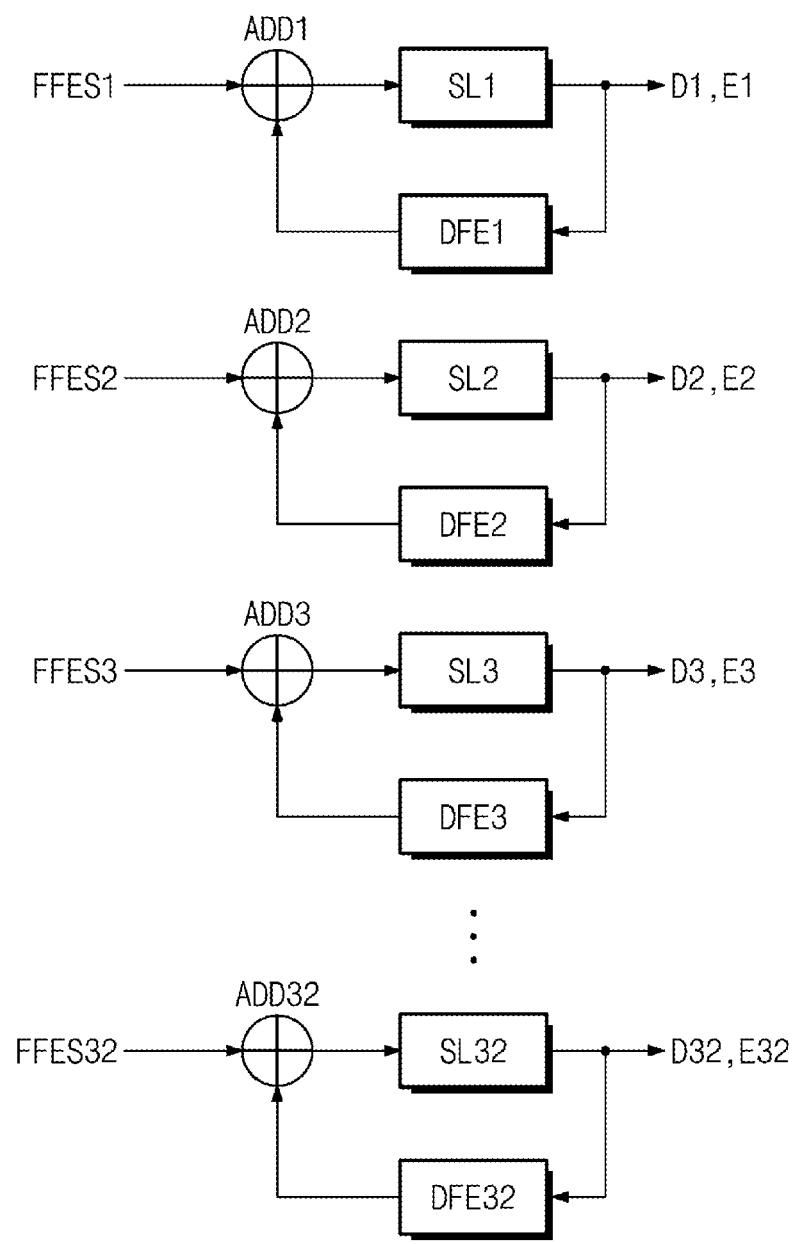
FIG. 7 illustrates a decision feedback equalization circuit according to some embodiments of the present disclosure.

FIG. 7 illustrates the decision feedback equalization circuit 443 according to some embodiments of the present disclosure. Referring to FIGS. 4 and 7, the decision feedback equalization circuit 443 may include first to 32nd adders ADD1 to ADD32, first to 32nd slicers SL1 to SL32, and first to 32nd decision feedback equalizers DFE1 to DFE32.

The first to 32nd adders ADD1 to ADD32 may add respective outputs of the first to 32nd slicers SL1 to SL32 and respective outputs of the first to 32nd decision feedback equalizers DFE1 to DFE32. The first to 32nd slicers SL1 to SL32 may generate first to 32nd data values D1 to D32 (e.g., digital values) and first to 32nd decision error values E1 to E32 (e.g., digital values) from outputs of the first to 32nd adders ADD1 to ADD32. The first to 32nd decision feedback equalizers DFE1 to DFE32 may output results of multiplying pass data values, the number of which is determined in advance, and the second coefficients COF2 together.

In some embodiments, the number of decision feedback equalizers of the decision feedback equalization circuit 443 may be set to coincide with the number of analog-to-digital converters of the analog-to-digital converter circuit 430.

Figure 8:
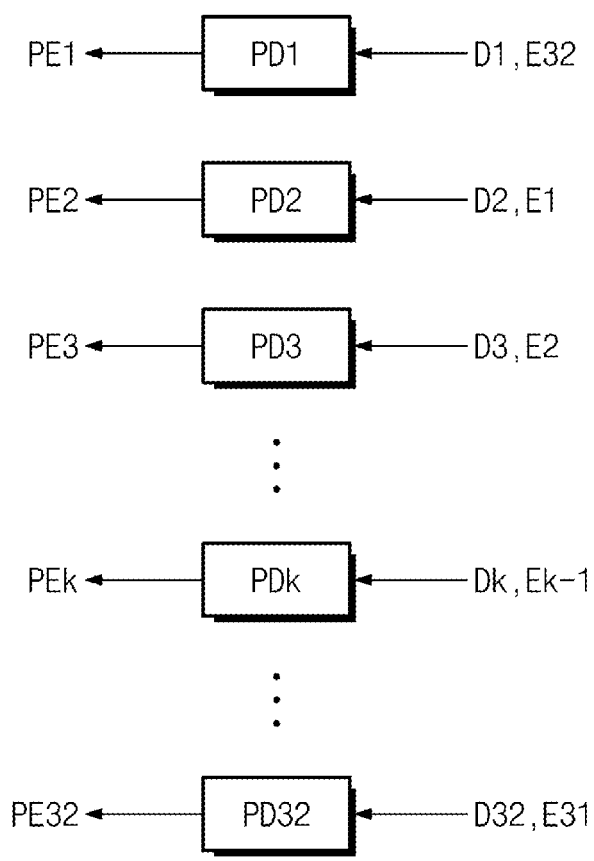
FIG. 8 illustrates a first phase detector circuit according to some embodiments of the present disclosure.

FIG. 8 illustrates the first phase detector circuit 450 according to some embodiments of the present disclosure. Referring to FIGS. 4 and 8, the first phase detector circuit 450 may include first to 32nd phase detectors PD1 to PD32. The first to 32nd phase detectors PD1 to PD32 may generate first to 32nd phase error values PE1 to PE32 (e.g., digital values) based on the first to 32nd data values D1 to D32 and the first to 32nd decision error values E1 to E32.

The first phase detector PD1 may generate the first phase error value PE1 from the first data value D1 and the 32nd decision error value E32. The k-th phase detector PDk may generate the k-th phase error value PEK from the k-th data value Dk and the (k–1)-th decision error value Ek-1 (e.g., k-1+32 when "k-1" is smaller than "1"). In some embodiments, the first to 32nd phase detectors PD1 to PD32 may generate the first to 32nd phase error values PE1 to PE32 based on a Mueller Muller algorithm.

Figure 9:
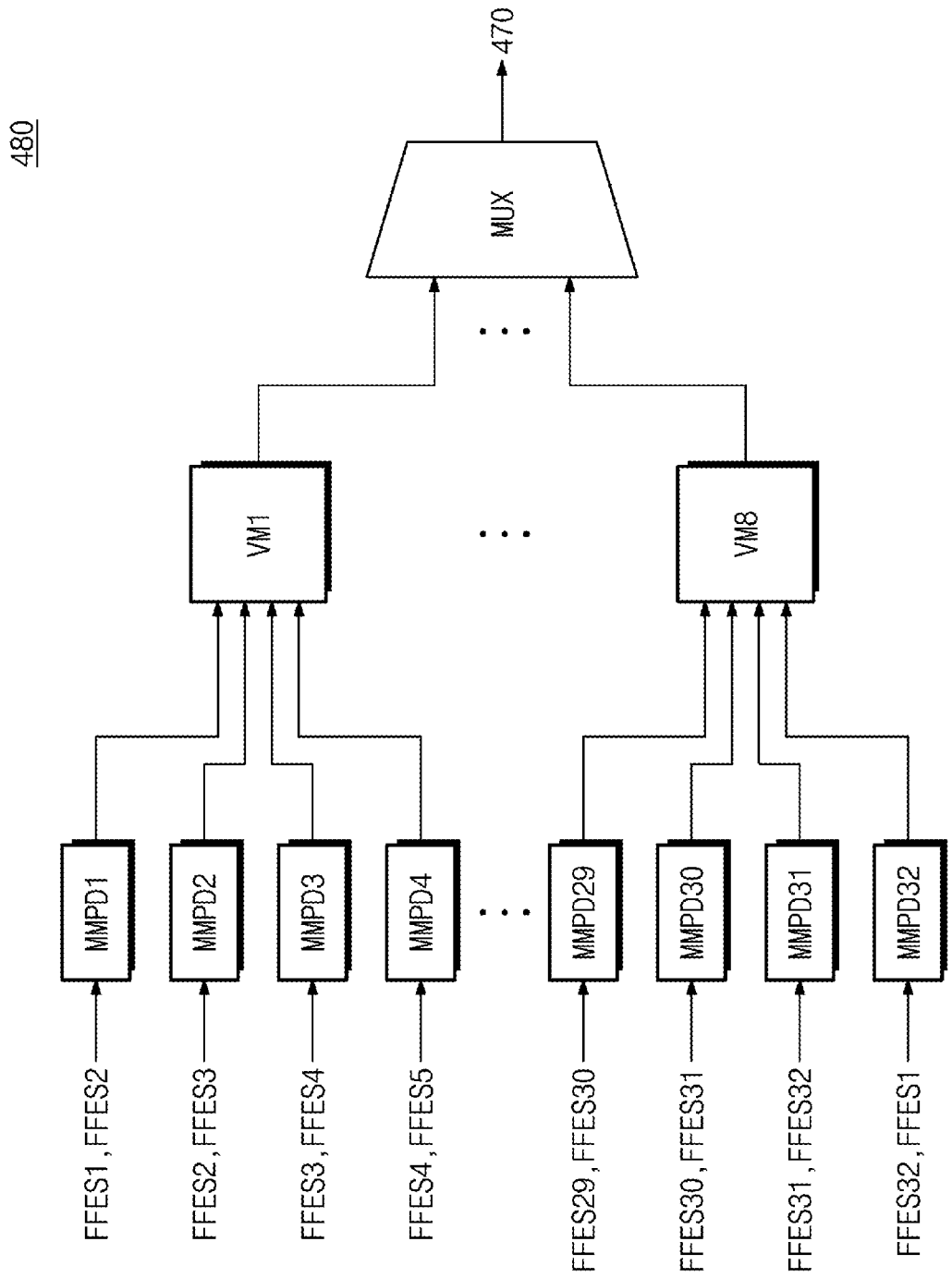
FIG. 9 illustrates a second phase detector circuit according to some embodiments of the present disclosure.

FIG. 9 illustrates the second phase detector circuit 480 according to some embodiments of the present disclosure. Referring to FIGS. 4 and 9, the second phase detector circuit 480 may include first to 32nd Mueller Muller phase detectors MMPD1 to MMPD32, first to eighth voting modules VM1 to VM8, and a multiplexer MUX.

Each of the first to 32nd Mueller Muller phase detectors MMPD1 to MMPD32 may receive digital values converted by the analog-to-digital converter circuit 430 at different timings that are neighboring (or consecutive).

The first Mueller Muller phase detector MMPD1 may receive the first feed forward equalization signal FFES1 and the second feed forward equalization signal FFES2. The k-th Mueller Muller phase detector MMPDk may receive the k-th feed forward equalization signal FFESk and the (k+1)-th feed forward equalization signal FFESk+1 (e.g., k+1-32 when "k+1" is greater than 32).

Each of the first to 32nd Mueller Muller phase detectors MMPD1 to MMPD32 may determine whether a phase (e.g., timing) at which the analog-to-digital converter circuit 430 converts a level of an analog signal to a digital value is accurate, early, or late, from the received digital values.

Each of the first to eighth voting modules VM1 to VM8 may receive outputs of two or more (e.g., four) Mueller Muller phase detectors. Each of the first to eighth voting modules VM1 to VM8 may determine, from the outputs of Mueller Muller phase detectors connected therewith, whether a phase (e.g., timing) at which the analog-to-digital converter circuit 430 converts a level of an analog signal to a digital value is accurate, early, or late. For example, each of the first to eighth voting modules VM1 to VM8 may output one, which is determined to be a majority, from among the outputs of the Mueller Muller phase detectors connected therewith.

The multiplexer MUX may output determination results of the first to eighth voting modules VM1 to VM8 to the digital controlled oscillator 470. For example, at a first timing, the multiplexer MUX may output the determination result of the first voting module VM1. At a second timing following the first timing, the multiplexer MUX may output the determination result of the second voting module VM2. The multiplexer MUX may repeat sequentially outputting the determination results of the first to eighth voting modules VM1 to VM8.

Figure 10:
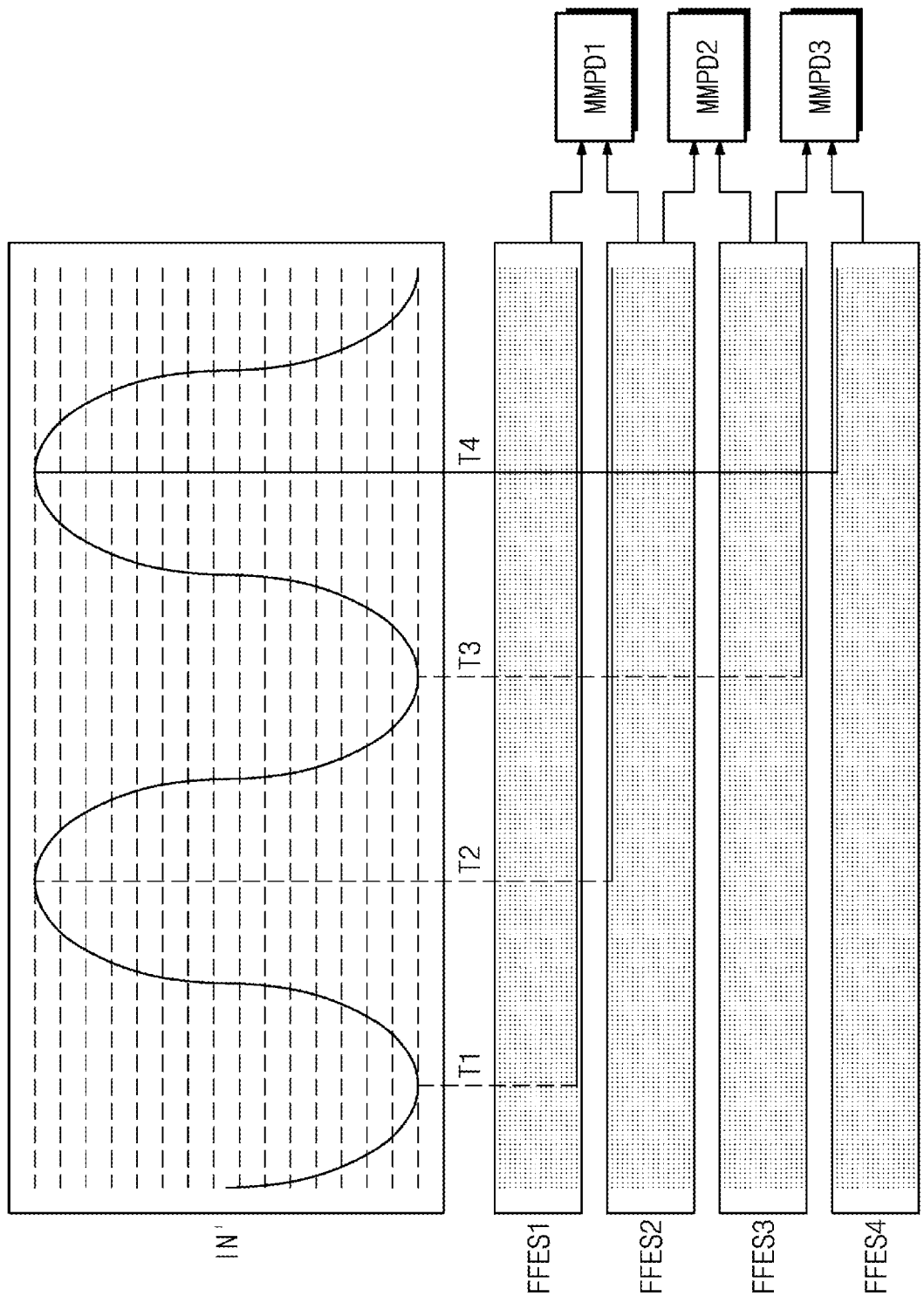
FIG. 10 illustrates an example in which first to third Mueller Muller phase detectors detect phases when a frequency of a clock signal is equal to a frequency of an input signal and a phase of the clock signal is equal to a phase of the input signal.
Figure 11:
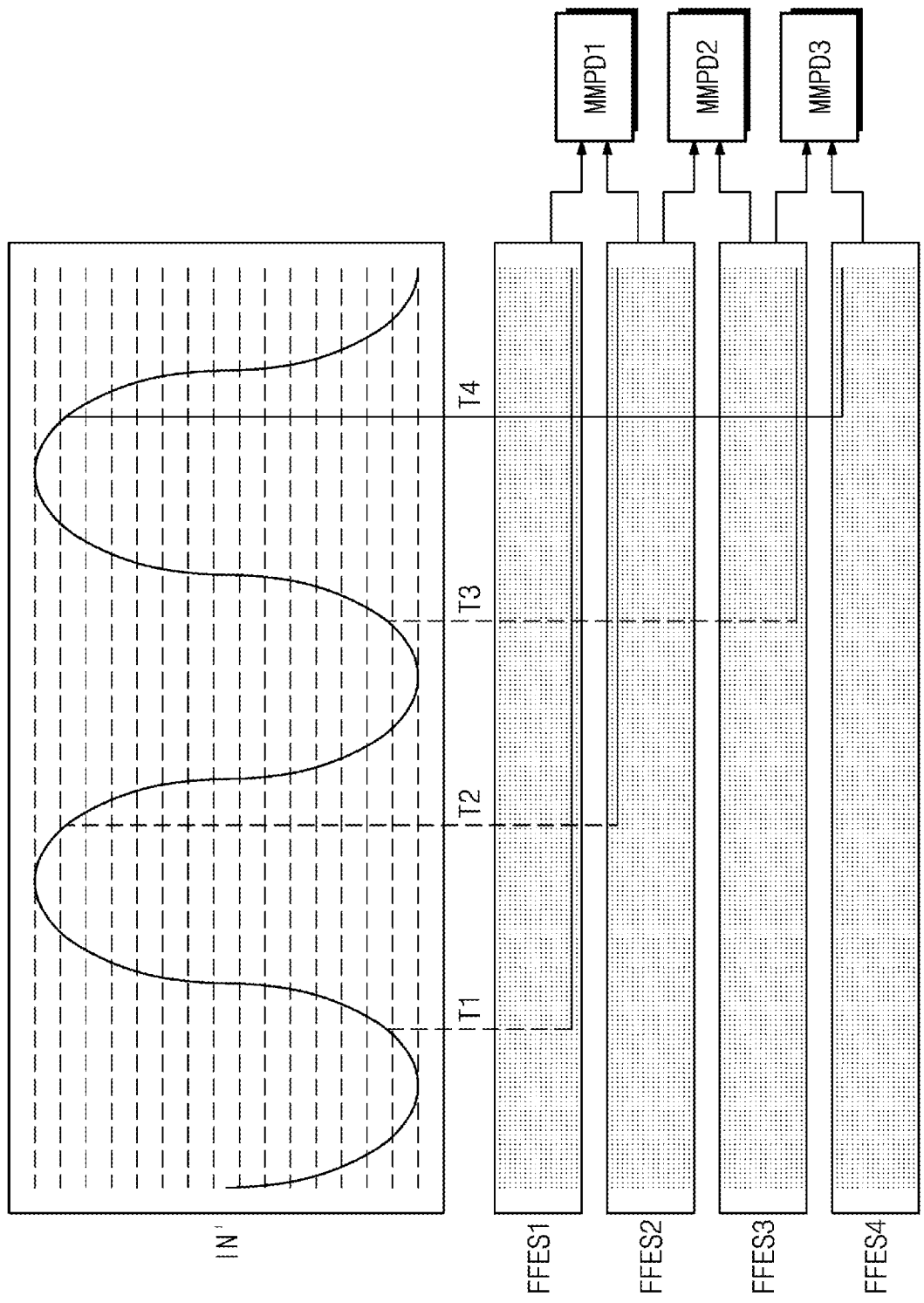
FIG. 11 illustrates an example in which first to third Mueller Muller phase detectors detect phases when a frequency of a clock signal is equal to a frequency of an input signal and a phase of the clock signal is delayed with respect to a phase of the input signal.
Figure 12:
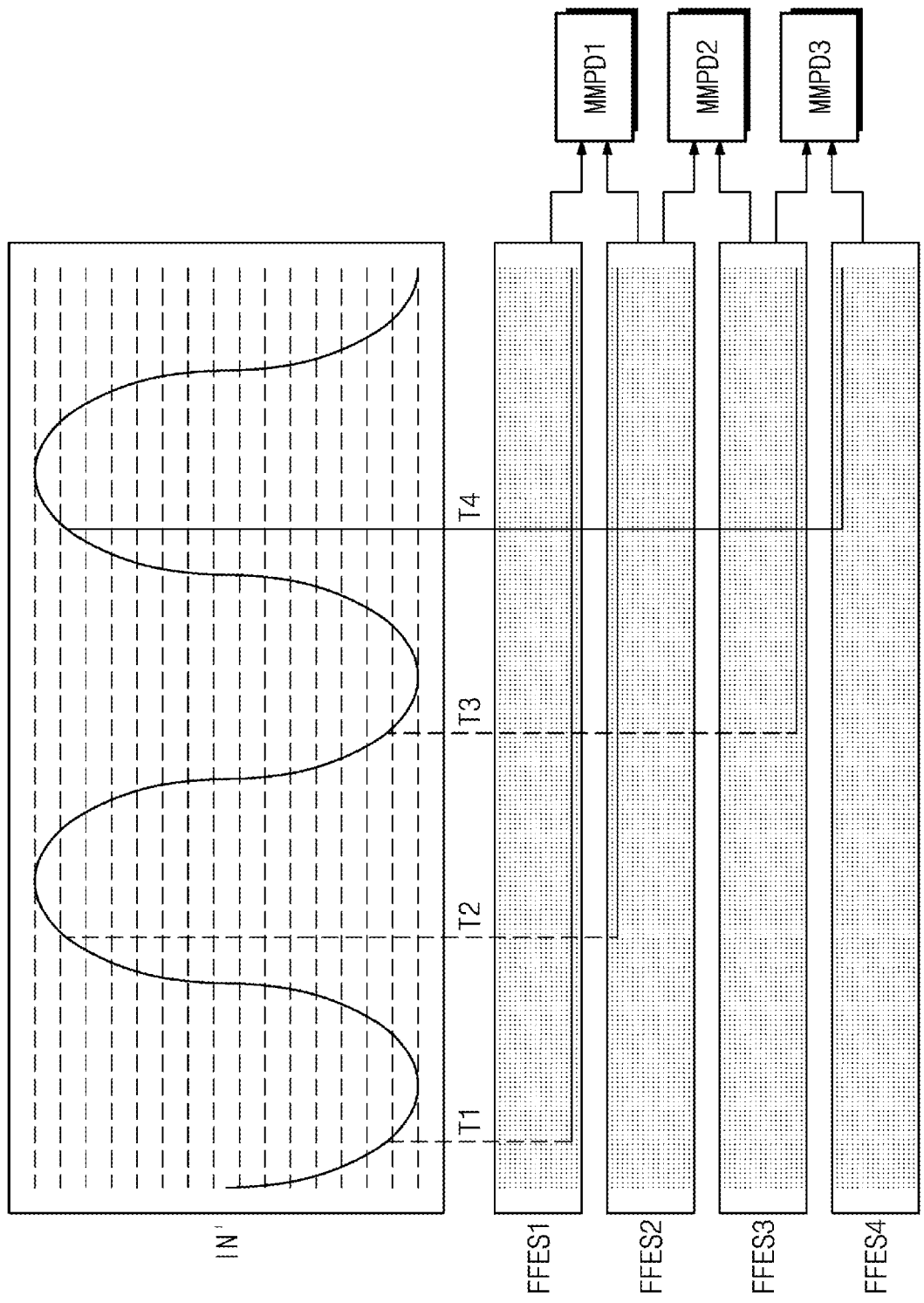
FIG. 12 illustrates an example in which first to third Mueller Muller phase detectors detect phases when a frequency of a clock signal is equal to a frequency of an input signal and a phase of the clock signal is advanced with respect to a phase of the input signal.

FIG. 10 illustrates an example in which the first to third Mueller Muller phase detectors MMPD1 to MMPD3 detect phases when a frequency of the clock signal CLK is equal to a frequency of the input signal IN and a phase of the clock signal CLK is equal to a phase of the input signal IN. FIG. 11 illustrates an example in which the first to third Mueller Muller phase detectors MMPD1 to MMPD3 detect phases when a frequency of the clock signal CLK is equal to a frequency of the input signal IN and a phase of the clock signal CLK is delayed with respect to a phase of the input signal IN. FIG. 12 illustrates an example in which the first to third Mueller Muller phase detectors MMPD1 to MMPD3 detect phases when a frequency of the clock signal CLK is equal to a frequency of the input signal IN and a phase of the clock signal CLK is advanced with respect to a phase of the input signal IN. In FIGS. 10, 11, and 12, a horizontal axis represents a time, and a vertical axis represents a level of an input signal IN' from which the inter-symbol interference (ISI) is removed.

Referring to FIGS. 4, 5, 9, and 10, at a first timing T1, the first analog-to-digital converter ADC1 may convert a level of an analog input signal into a digital value. A digital value of the first feed forward equalization signal FFES1 in which the inter-symbol interference is suppressed may correspond to the level of the input signal IN' from which the inter-symbol interference is removed. At a second timing T2, the second analog-to-digital converter ADC2 may convert a level of the analog input signal to a digital value. A digital value of the second feed forward equalization signal FFES2 in which the inter-symbol interference is suppressed may correspond to the level of the input signal IN' from which the inter-symbol interference is removed. The first Mueller Muller phase detector MMPD1 may compare the digital value of the first timing T1 and the digital value of the second timing T2; depending on a comparison result, the first Mueller Muller phase detector MMPD1 may output or may not output "early" or "late".

At a third timing T3, the third analog-to-digital converter ADC3 may convert a level of the analog input signal to a digital value. A digital value of the third feed forward equalization signal FFES3 in which the inter-symbol interference is suppressed may correspond to the level of the input signal IN' from which the inter-symbol interference is removed. The second Mueller Muller phase detector MMPD2 may compare the digital value of the second timing T2 and the digital value of the third timing T3; depending on a comparison result, the second Mueller Muller phase detector MMPD2 may output or may not output "early" or "late".

At a fourth timing T4, the fourth analog-to-digital converter ADC4 may convert a level of the analog input signal to a digital value. A digital value of the fourth feed forward equalization signal FFES4 in which the inter-symbol interference is suppressed may correspond to the level of the input signal IN' from which the inter-symbol interference is removed. The third Mueller Muller phase detector MMPD3 may compare the digital value of the third timing T3 and the digital value of the fourth timing T4; depending on a comparison result, the third Mueller Muller phase detector MMPD3 may output or may not output "early" or "late".

As described with reference to FIGS. 10, 11, and 12, each of the first to 32nd Mueller Muller phase detectors MMPD1 to MMPD32 may determine an accurate phase, an early phase, or a late phase by comparing phases at which the analog-to-digital converter circuit 430 converts a level of an analog input signal to a digital value, at timings neighboring (or consecutive).

In FIGS. 10, 11, and 12, an output of the first Mueller Muller phase detector MMPD1 may be stabilized from after the second timing T2. An output of the second Mueller Muller phase detector MMPD2 may be stabilized from after the third timing T3. An output of the third Mueller Muller phase detector MMPD3 may be stabilized from after the fourth timing T4.

The multiplexer MUX (refer to FIG. 9) may operate in the time interleaving manner such that there is output a determination result of a voting module connected with Mueller Muller phase detectors whose outputs are stabilized. For example, after the outputs of the first to fourth Mueller Muller phase detectors MMPD1 to MMPD4 are stabilized, the multiplexer MUX may output the determination result of the first voting module VM1. After the outputs of the i-th to (i+3)-th Mueller Muller phase detectors MMPDi+1 to MMPDi+4 (i being an integer between 1 and 7) are stabilized, the multiplexer MUX may output the determination result of the (i+1)-th voting module VMi+1.

Figure 13:
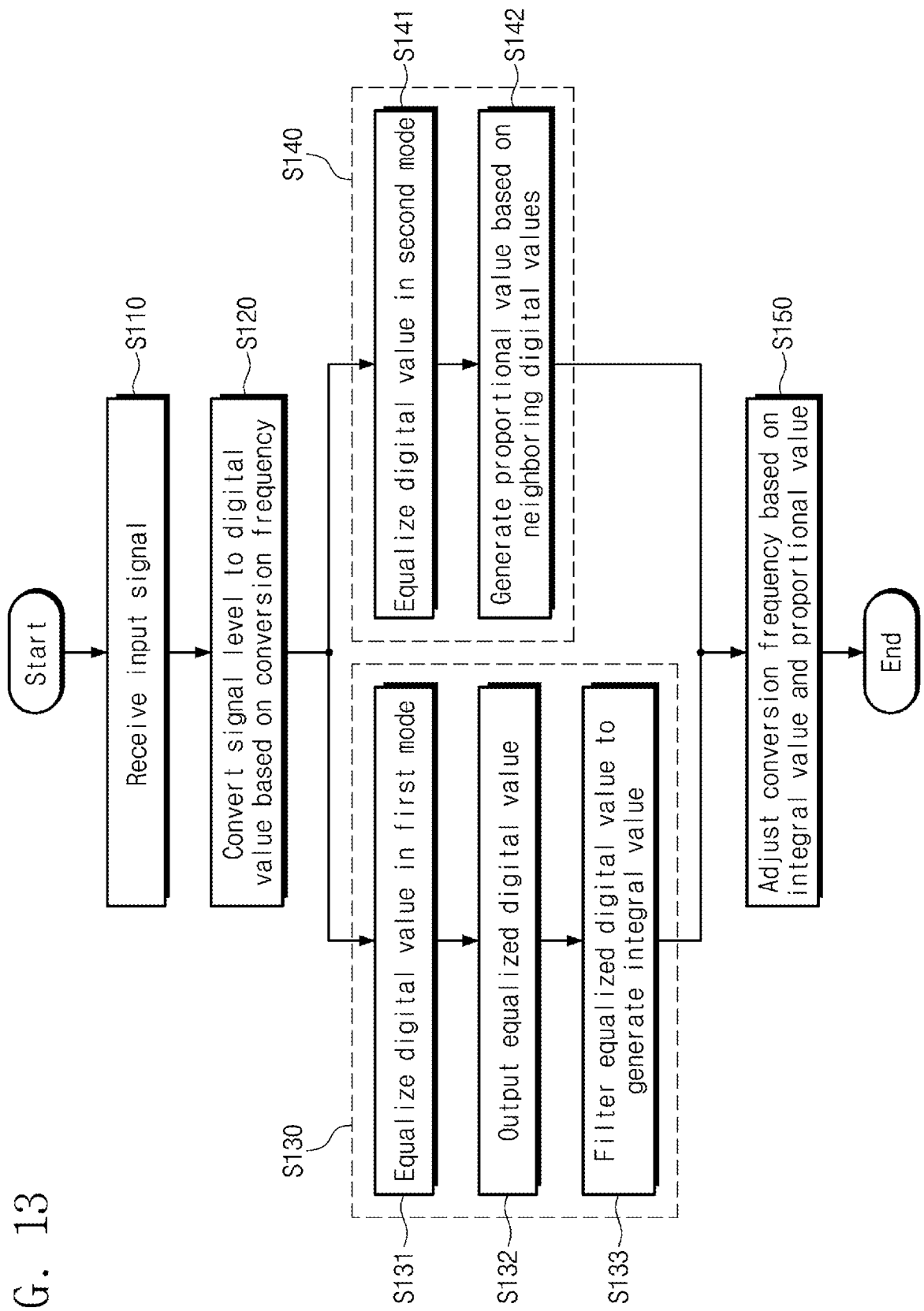
FIG. 13 illustrates an operating method of a PCIe-based electronic device according to some embodiments of the present disclosure.

FIG. 13 illustrates an operating method of a PCIe-based electronic device (e.g., 130, 140, 150, 160, 170, or 180) according to some embodiments of the present disclosure. In some embodiments, an operating method of the receiver 400 of a PCIe-based electronic device (e.g., 130, 140, 150, 160, 170, or 180) is illustrated.

Referring to FIGS. 1, 4, and 13, in operation S110, the receiver 400 may receive the input signal IN. In operation S120, the receiver 400 may convert a level of an analog signal to a digital value based on a conversion frequency.

In operation S130, the receiver 400 may generate a first digital value by equalizing the digital value by using the first equalization circuit 440. Operation S130 may include operation S131, operation S132, and operation S133. In operation S131, the receiver 400 may equalize the digital value in a first operation mode. In operation S132, the receiver 400 may output the equalized digital value. In operation S133, the receiver 400 may filter the equalized digital value to generate an integral value, that is, the first digital value.

In operation S140, the receiver 400 may generate a second digital value by equalizing the digital value by using the second equalization circuit 490. Operation S140 may include operation S141 and operation S142. In operation S141, the receiver 400 may equalize the digital value in a second operation mode. In operation S142, the receiver 400 may generate a proportional value, that is, a second digital value based on neighboring digital values, for example, neighboring digital values on the timing.

Operation S130 and operation S140 may be performed in parallel. In operation S150, the receiver 400 may adjust the conversion frequency based on the integral value (i.e., the first digital value) and the proportional value (i.e., the second digital value).

As described above, the receiver 400 of a PCIe-based electronic device (e.g., 130, 140, 150, 160, 170, or 180) according to some embodiments of the present disclosure may output a digital value by using a synchronous digital equalization circuit and may generate the integral value. The receiver 400 of the PCIe-based electronic device (e.g., 130, 140, 150, 160, 170, or 180) according to some embodiments of the present disclosure may generate the proportional value by using an asynchronous digital equalization circuit and a phase detector. The integral value and the proportional value may be used to adjust the frequency and phase of the clock signal CLK of the digital controlled oscillator 470. Accordingly, the jitter may be suppressed in the receiver 400, and the jitter tolerance (JTOL) may be improved.

In some of the embodiments described herein, components according to the present disclosure are described by using the terms "first," "second," "third," etc. However, the terms "first," "second," "third," etc. may be used to distinguish components from each other and do not limit the present disclosure. For example, the terms "first," "second," "third," etc. do not involve an order or a numerical meaning of any form.

In some of the embodiments described herein, some components according to embodiments of the present disclosure are referenced by using blocks. The blocks may be implemented with various hardware devices, such as an integrated circuit, an application specific IC (ASIC), a field programmable gate array (FPGA), and a complex programmable logic device (CPLD), firmware driven in hardware devices, software such as an application, or a combination of a hardware device and software. Also, the blocks may include circuits implemented with semiconductor elements in an integrated circuit, or circuits enrolled as an intellectual property (IP).

According to the present disclosure, electronic devices may more quickly adjust a conversion frequency that is used to convert an analog signal to a digital value. Accordingly, electronic devices may be configured to suppress, or capable of suppressing, a jitter even though a frequency of an analog signal received from an external electronic device increases. Operating methods of electronic devices are also provided.

While the present disclosure has been described with reference to some embodiments thereof, it will be apparent to those of ordinary skill in the art that various changes and modifications may be made thereto without departing from the scope of the present disclosure as set forth in the following claims.

What is claimed is:

1. An electronic device comprising:
   an analog-to-digital converter circuit configured to convert a level of an input signal to digital input values in response to a clock signal;
   an oscillator configured to generate the clock signal;
   a first equalization circuit configured to generate digital output signals by equalizing the digital input values;
   a first phase detector circuit configured to detect phases of the digital output signals and to generate digital phase values;
   a loop filter configured to generate a first digital output value based on the digital phase values;
   a second equalization circuit configured to generate digital intermediate values by equalizing the digital input values; and
   a second phase detector circuit configured to detect phases of the digital intermediate values and to generate a second digital output value,
   wherein the oscillator is configured to adjust a frequency of the clock signal based on the first digital output value and the second digital output value,
   wherein the analog-to-digital converter circuit includes:
   a plurality of analog-to-digital converters configured to convert the level of the input signal to the digital input values at different timings, and
   wherein the digital input values have different phases.

2. The electronic device of claim 1, wherein the first equalization circuit includes:
   an aligner configured to align timings of the digital input values and output a plurality of aligned digital input values;
   a plurality of feed forward equalizers configured to perform feed forward equalization (FFE) on the plurality of aligned digital input values and output a plurality of first equalization signals; and
   a plurality of decision feedback equalizers configured to perform decision feedback equalization (DFE) on the plurality of first equalization signals and generate the digital output signals.

3. The electronic device of claim 2, wherein the second equalization circuit include:
   a plurality of feed forward equalizers configured to perform feed forward equalization (FFE) on the digital input values and output the digital intermediate values.

4. The electronic device of claim 3, wherein a number of taps of the plurality of feed forward equalizers of the second equalization circuit is less than a number of taps of the plurality of feed forward equalizers of the first equalization circuit.

5. The electronic device of claim 3, wherein the first equalization circuit is configured to adjust adaptively coefficients that are applied to taps of the plurality of feed forward equalizers of the first equalization circuit, and
wherein the first equalization circuit is configured to provide some of the coefficients adjusted by the first equalization circuit to taps of the plurality of feed forward equalizers of the second equalization circuit.

6. The electronic device of claim 1, wherein the second phase detector circuit includes a plurality of phase detectors, and
wherein each of the plurality of phase detectors receives digital intermediate values generated at consecutive timings from among the digital intermediate values to output an early or late signal.

7. The electronic device of claim 6, wherein the plurality of phase detectors include baud-rate phase detectors, and
wherein each of the baud-rate phase detectors includes a Mueller Muller phase detector.

8. The electronic device of claim 6, wherein the second phase detector circuit further includes a plurality of voting modules,
wherein each of the plurality of voting modules is configured to:
receive signals from two or more of the plurality of phase detectors;
determine whether one of the signals is early or late; and
output a result of the determination as a determination result.

9. The electronic device of claim 8, wherein the second phase detector circuit further includes:
a multiplexer configured to select one of the plurality of voting modules and to output the determination result of the selected voting module as the second digital output value.

10. The electronic device of claim 9, wherein the multiplexer selects the plurality of voting modules in a time interleaving manner.

11. The electronic device of claim 1, wherein the first equalization circuit operates at a baud rate in synchronization with the clock signal.

12. The electronic device of claim 1, wherein the first equalization circuit is configured to generate the digital output signals in a first mode, and wherein the second equalization circuit configured to generate the digital intermediate values in a second mode.

13. The electronic device of claim 1, wherein the electronic device is included in a peripheral component interconnect express (PCIe) root complex, a PCIe switch, a PCIe endpoint, a PCIe bridge, or a PCIe/legacy endpoint.

14. An electronic device comprising:
an analog-to-digital converter circuit configured to convert a level of an input signal to digital input values in response to a clock signal;
an oscillator configured to generate the clock signal;
a first equalization circuit configured to operate in response to the clock signal and to generate digital output signals by equalizing the digital input values;
a first phase detector circuit configured to operate in synchronization with the clock signal and to detect phases of the digital output signals and to generate digital phase values;
a loop filter configured to operate in response to the clock signal and to generate a first digital output value based on the digital phase values;
a second equalization circuit configured to generate digital intermediate values by equalizing the digital input values asynchronously; and
a second phase detector circuit configured to detect phases of the digital intermediate values asynchronously and to generate a second digital output value,
wherein the oscillator is configured to adjust a frequency of the clock signal based on the first digital output value and the second digital output value,
wherein the analog-to-digital converter circuit includes:
a plurality of analog-to-digital converters configured to convert the level of the input signal to the digital input values at different timings, and
wherein the digital input values have different phases.

15. The electronic device of claim 14, wherein the first equalization circuit is configured to align the digital input values so as to be equalized synchronously.

16. The electronic device of claim 14, wherein the second equalization circuit include:
a plurality of feed forward equalizers configured to perform feed forward equalization (FFE) on the digital input values to output the digital intermediate values.

17. The electronic device of claim 14, wherein the second phase detector circuit includes:
a plurality of phase detectors;
a plurality of voting modules; and
a multiplexer,
wherein each of the plurality of phase detectors receives digital intermediate values generated at consecutive timings from among the digital intermediate values and to output a signal,
wherein each of the plurality of voting modules receives signals from two or more of the plurality of phase detectors, determines whether one of the signals is early or late, and outputs a result of the determination as a determination result, and
wherein the multiplexer selects one of the plurality of voting modules and outputs the determination result of the selected voting module as the second digital output value.

18. An operation method of an electronic device which includes a first equalization circuit and a second equalization circuit, the method comprising:
receiving an input signal;
converting a level of the input signal to a plurality of digital input values at different timings based on a conversion frequency, the plurality of digital input values having different phases;
equalizing, at the first equalization circuit, the plurality of digital input values to generate a first output value;
equalizing, at the second equalization circuit, the plurality of digital input values to generate a second output value; and
adjusting the conversion frequency based on the first output value and the second output value.

* * * * *